United States Patent
Berkhout et al.

(10) Patent No.: US 8,067,980 B2
(45) Date of Patent: Nov. 29, 2011

(54) PULSE WIDTH MODULATION CIRCUIT AND CLASS-D AMPLIFIER COMPRISING THE PWM CIRCUIT

(75) Inventors: Marco Berkhout, Tiel (NL); Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 11 days.

(21) Appl. No.: 12/665,734

(22) PCT Filed: Jun. 19, 2008

(86) PCT No.: PCT/IB2008/052419
§ 371 (c)(1),
(2), (4) Date: Dec. 21, 2009

(87) PCT Pub. No.: WO2009/001254
PCT Pub. Date: Dec. 31, 2008

(65) Prior Publication Data
US 2010/0176881 A1    Jul. 15, 2010

(30) Foreign Application Priority Data
Jun. 27, 2007 (EP) .................................. 07111180

(51) Int. Cl.
*H03F 3/38* (2006.01)
(52) U.S. Cl. ........................................................ 330/10
(58) Field of Classification Search .............. 330/10; 332/109, 110; 375/238
See application file for complete search history.

(56) References Cited

U.S. PATENT DOCUMENTS

| | | | |
|---|---|---|---|
| 3,316,497 A | 4/1967 | Brooks | |
| 3,390,341 A | 6/1968 | Kline | |
| 3,654,563 A | 4/1972 | Hesler et al. | |
| 4,749,951 A | 6/1988 | Tanaka | |
| 6,577,186 B2* | 6/2003 | Berkhout | 330/10 |
| 7,262,658 B2* | 8/2007 | Ramaswamy et al. | 330/251 |
| 2005/0156665 A1 | 7/2005 | Maejima | |
| 2009/0315623 A1* | 12/2009 | Dooper et al. | 330/251 |

FOREIGN PATENT DOCUMENTS

| | | |
|---|---|---|
| EP | 0644649 A2 | 3/1995 |
| EP | 1594244 A2 | 11/2005 |
| EP | 1630954 A1 | 3/2006 |
| EP | 1657815 A1 | 5/2006 |
| WO | 02/086795 A1 | 10/2002 |

OTHER PUBLICATIONS

Berkhout, M. "An Integrated 200-W Class-D Audio Amplifier," IEEE Journal of Solid-State Circuits, vol. 38, No. 7 (Jul. 2003), pp. 1198-1206.

(Continued)

Primary Examiner — Steven J Mottola (57) ABSTRACT

A pulse width modulation (PWM) circuit comprises a first integrator (g m1) with a first feedback capacitor ($C_1$), a second integrator ($g_{m1}$) with a second feedback capacitor ($C_2$) and a comparator ($A_0$) having a first input ($V_1$) connected to the output of the first integrator ($g_{m1}$) and a second input ($V_2$) connected to the output of the second integrator ($g_{m2}$). A connection path comprising a resistor ($R_2$) is established from the output of the first integrator ($g_{m1}$) to an input of the second integrator ($g_{m2}$). The first and second feedback capacitors ($C_1$, $C_2$) have capacities with a non-linear factor X(V) and a circuit with an inversely non-linear factor $X^{-1}$(V) is arranged in the connection path between the output of the first integrator ($g_{m1}$) and said input of the second integrator ($g_{m2}$). The PWM circuit may form path of a Class-D amplifier.

9 Claims, 8 Drawing Sheets

OTHER PUBLICATIONS

Behr, A.T. et al. Nonlinearities of Capacitors Realized by MOSFET Gatesproceedings of the Int'l Symposium on Circuits and Systems (IEEE), vol. 3 (May 1992), pp. 1284-1287.

Gaalaas, E. et al. "Integrated Stereo ΔΣ Class D Amplifier", IEEE Journal of Solid-State Circuits, vol. 40, No. 12 (Dec. 2005), pp. 2388-2397.

Wang, C. et al. "A Nonlinear Capacitance Cancellation Technique and Its Application to a CMOS Class AB Power Amplifier", 2001 IEEE Radio Frequency Integrated Circuits Symposium (May 2001), pp. 39-42.

International Search Report for Int'l Patent Appln. No. PCT/IB2008/052419 (Nov. 27, 2008).

* cited by examiner

PULSE WIDTH MODULATION CIRCUIT AND CLASS-D AMPLIFIER COMPRISING THE PWM CIRCUIT

FIELD OF THE INVENTION

The invention relates to a pulse width modulation (PWM) circuit comprising a first integrator with a first feedback capacitor, a second integrator with a second feedback capacitor and a comparator having a first input connected to the output of the first integrator and a second input connected to the output of the second integrator, wherein a connection path comprising a resistor is established from the output of the first integrator to an input of the second integrator.

The invention further relates to a Class-D amplifier.

BACKGROUND OF THE INVENTION

Figure 1:
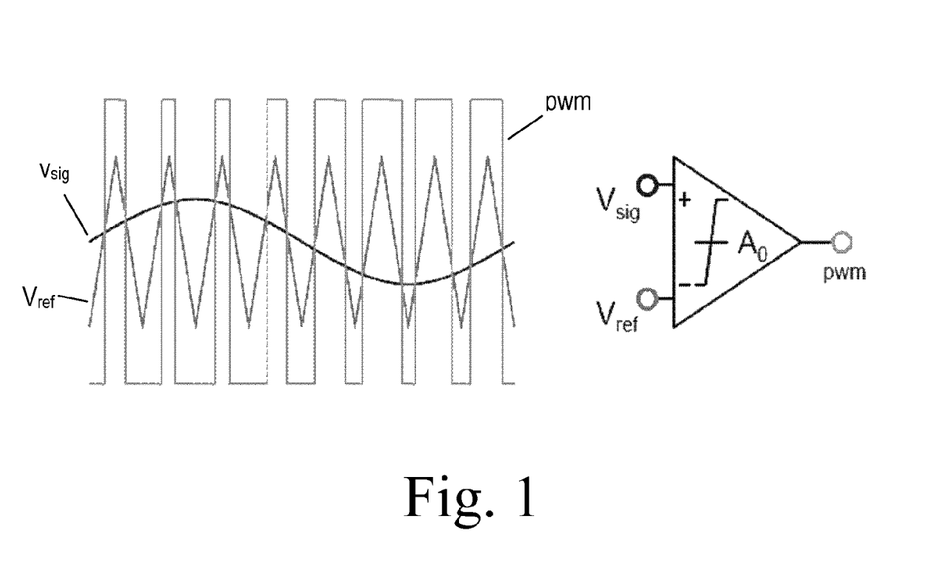
FIG. 1 shows a signal diagram of Feed-Forward PWM as well as a comparator used in Feed-Forward PWM.

In most Class-D amplifiers some form of pulse-width modulation (PWM) is applied. A PWM signal can be constructed feed-forward by simply comparing the input signal $V_{sig}$ with a triangular reference wave $V_{ref}$ as shown in FIG. 1. Usually the frequency of the reference wave $V_{ref}$ is much higher than that of the input signal $V_{sig}$.

Ideally, the spectrum of the PWM signal does not contain harmonics of the modulating signal, which means it can be considered ideal in terms of distortion. However, this is only true if the reference wave $V_{ref}$ has sufficient linearity, i.e. the slopes of the reference wave $V_{ref}$ need to be perfectly straight.

Figure 2:
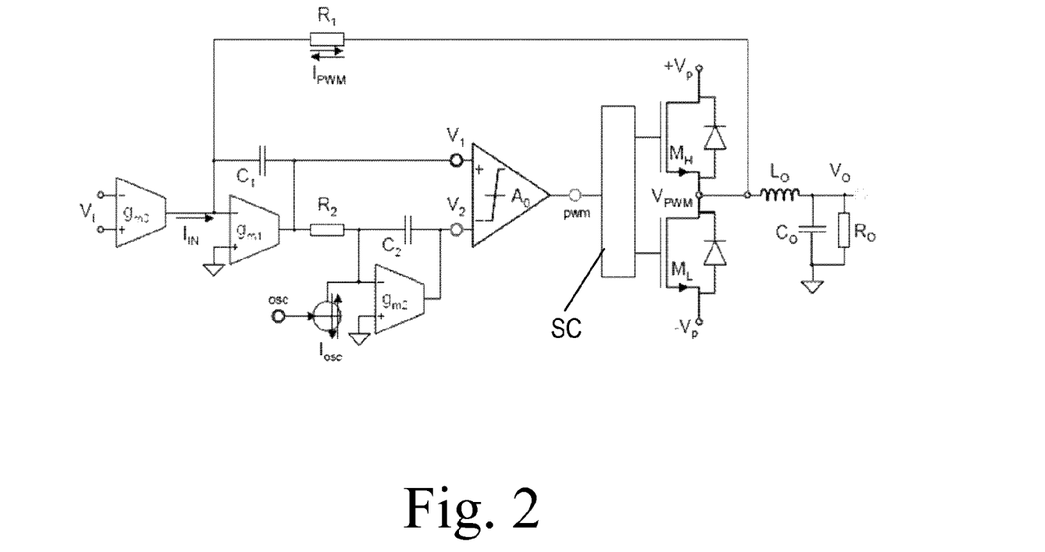
FIG. 2 shows a class-D feedback loop circuit according to prior art.

Many Class-D amplifiers use an integrating feedback loop to provide power supply rejection and correction of switching errors in the output stage. An example of such a feedback loop is shown in FIG. 2. The operation of this loop is described in detail in Berkhout, M. "An Integrated 200W Class-D Audio Amplifier", IEEE J. Solid-State Circuits, vol. 38, no. 7, pp. 1198-1206, July. 2003, [1], which is herewith incorporated in the application by reference. The loop has two integrators configured around amplifiers $g_{m1}$ and $g_{m2}$. The two integrators realize a second-order loop transfer. The output signal $V_{PWM}$ of the amplifier is a square wave pulse-width modulated (PWM) signal. The load $R_O$ is connected to the amplifier by means of a low-pass LC-filter ($L_0$, $C_0$). The output voltage $V_{PWM}$ is converted to a current $I_{PWM}$ by feedback resistor $R_1$ and injected into the virtual ground of the first integrator $g_{m1}$. This yields a triangular wave $V_1$ at the output of the first integrator $g_{m1}$. A reference clock signal osc is converted to a square wave current $I_{osc}$ that is injected into the virtual ground of the second integrator $g_{m2}$. This yields a second (reference) triangular wave $V_2$ at the output of the second integrator. The triangular wave signals $V_1$ and $V_2$ are fed to the non-inverting and inverting inputs of a comparator $A_0$. When the triangular waves intersect the comparator output pwm changes state and the output $V_{PWM}$ of the amplifier switches yielding the desired PWM signal. Note that the peaks of signal $V_2$ coincide with the edges of signal osc and the peaks of signal $V_1$ coincide with the edges of signal pwm. The input signal $V_I$ is converted to a current $I_{IN}$ by V-I converter $g_{m0}$ and injected into the virtual ground of the first integrator $g_{m1}$.

Figures 3A, 3B:
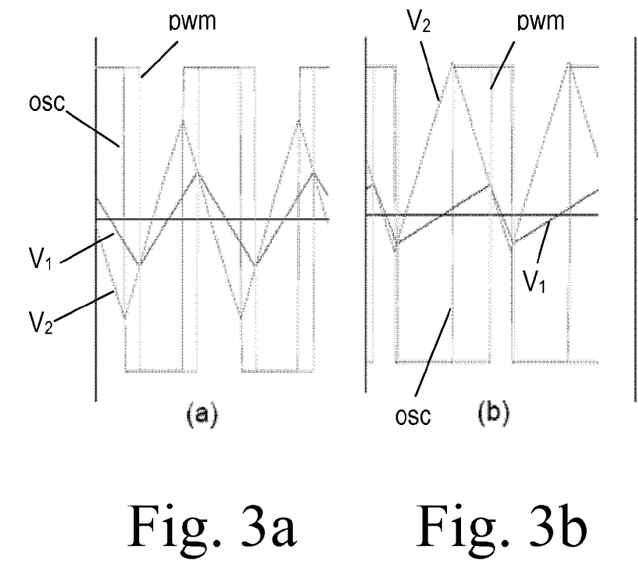
FIGS. 3a to 3c show timing diagrams of integrator signals $V_1$ and $V_2$, an oscillator signal osc and a comparator output signal pwm appearing in the circuit of FIG. 2 during: (a) zero input signal, (b) negative input signal (c), and positive input signal.
Figure 3C:
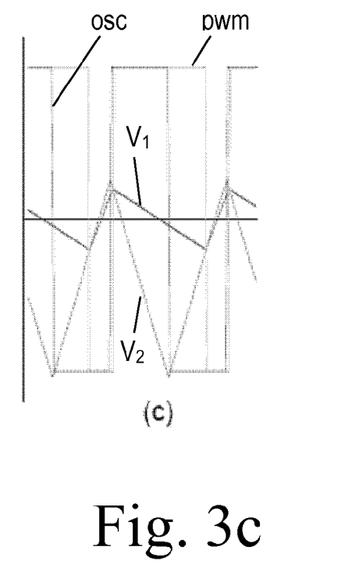

FIG. 3(a) shows the triangular wave signals $V_1$ and $V_2$ at zero input yielding a 50% PWM duty-cycle (see signal pwm). FIG. 3(b) shows the same signals when a negative input signal is applied. The input signal causes the slopes (and amplitude) of $V_1$ to change. The shape of $V_2$ remains (almost) the same but the DC-level is shifted with respect to zero. The output signal pwm of the comparator now has a duty-cycle smaller than 50%. The opposite happens for a positive input signal as shown in FIG. 3(c) (see signal pwm). In this manner a linear relation is realized between the input signal and the duty-cycle of the output signal $V_{PWM}$. In FIGS. 3(a) to 3(c) the oscillator signal is designated with reference sign osc.

Figure 4:
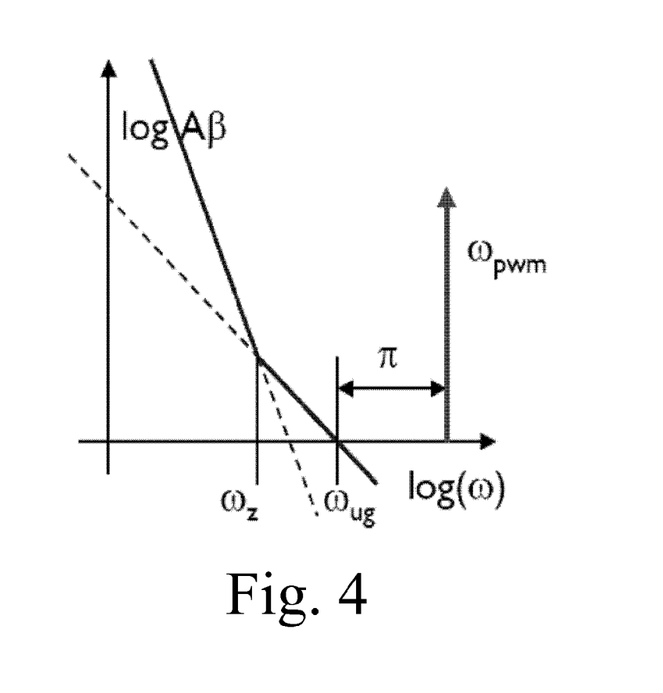
FIG. 4. shows a second order loop transfer with LHP zero.

The loop transfer $A\beta$ of the feedback loop shown in FIG. 2 is shown in FIG. 4. At low frequencies the loop transfer has a second order behaviour. At higher frequencies the second integrator $g_{m2}$ is by-passed by the direct path from the first integrator $g_{m1}$. This creates a zero in the loop transfer at the unity-gain frequency of the second integrator: $\omega_z=1/R_2C_2$.

The zero causes the loop transfer to have a first order behaviour near the unity gain frequency $\omega_{ug}$ of the loop. As is explained in [1] the unity gain frequency $\omega_{ug}$ is coupled to the PWM switching frequency $\omega_{pwm}$ by a factor $\pi$.

In current implementations the capacitors used in the integrators are required to be linear. This requirement is essentially a continuation of the linearity requirement of the reference wave $V_{ref}$ in feed-forward PWM generation described above. Unfortunately linear capacitors in IC processes tend to be large. Usually such capacitors are realized by exploiting the capacitance between metal-interconnect layers resulting in a relatively low capacitance per area. Gate-oxide capacitors on the other hand have high capacitance per area but suffer from non-linearity. Non-linearity of capacitors in the integrators not only distorts the (triangular) output signals of the integrators but also influences the frequency of the poles and zeros in the feedback loop. In a typical IC process the ratio in area between a linear metal-interconnect capacitor and a non-linear gate-oxide capacitor can easily be as high as a factor of twelve. Consequently, the use of linear capacitors constitutes a significant part of the total area of the circuit.

OBJECT AND SUMMARY OF THE INVENTION

It is an object of the invention to provide a PWM circuit of the type defined in the opening paragraph and a Class-D amplifier of the type defined in the second paragraph, in which the disadvantages defined above are avoided.

In order to achieve the object defined above, with a PWM circuit according to the invention characteristic features are provided so that a PWM circuit according to the invention can be characterized in the way defined below, that is:

A pulse width modulation circuit comprising a first integrator that comprises a first feedback capacitor, and a second integrator comprising a second feedback capacitor, and a comparator comprising a first input connected to the output of the first integrator; and a second input connected to the output of the second integrator, wherein a connection path comprising a resistor is established from the output of the first integrator to an input of the second integrator, and wherein the first and second feedback capacitors have capacitances with a non-linear factor X, and wherein a circuit with an inversely non-linear factor $X^{-1}$ is arranged in the connection path between the output of the first integrator and said input of the second integrator.

In order to achieve the object defined above, a Class-D amplifier according to the invention comprises a PWM circuit according to the above paragraph.

The characteristic features according to the invention provide the advantage that the use of non-linear gate-oxide capacitors in the integrators is allowed without degrading performance. Since non-linear gate-oxide capacitors require less area in integrated circuits than linear capacitors smaller and cheaper integrated circuits can be designed.

The present invention makes use of the observation that if the output signals of the integrators in the feedback loop are distorted in the same way the moments that the signals intersect remain unaffected and thus the same PWM signal is produced as would be without distortions.

The non-linear behaviour of the capacitors also influences the frequency of the zero in the loop transfer, which can cause the loop to become unstable under certain conditions.

A second essential feature of the invention is that this potential instability is avoided by making the value of the resistor connecting the two integrators to be non-linear in a way related to the capacitor non-linearity.

When the non-linear factors X(V) of the capacities of the feedback capacitors of the integrators are essentially equal they do not affect the comparison.

Implementing the feedback capacitors of the integrators as non-linear gate-oxide capacitors results in small and reliable integrated circuits. Connecting PMOS and NMOS gate-oxide capacitors in parallel results in a smoother overall capacitance.

In respect of integrated circuit design it is advantageous to incorporate the resistor between the first and second integrator in the circuit with an inversely non-linear factor $X^{-1}(V)$.

In a simple and easy to implement embodiment the circuit with an inversely non-linear factor $X^{-1}(V)$ comprises two anti-parallel connected diodes being serially connected to a first resistor, a second resistor bypassing the anti-parallel diodes and the first resistor.

In order to achieve diodes with solid state properties that are quite similar to those of the above mentioned capacitors it is suggested to configure the two anti-parallel connected diodes as MOS diodes, preferably a NMOS and a PMOS diode. In a preferred embodiment the two anti-parallel connected diodes are configured by a NMOS transistor and a PMOS transistor having their source and drain terminals connected to each other with the gate terminals short-circuited to the drain terminals.

The aspects defined above and further aspects of the invention are apparent from the exemplary embodiment to be described hereinafter and are explained with reference to this exemplary embodiment.

BRIEF DESCRIPTION OF THE DRAWINGS

The invention will be described in more detail hereinafter with reference to an exemplary embodiment. However, the invention is not limited to this exemplary embodiment.

DESCRIPTION OF EMBODIMENTS

Figure 5:
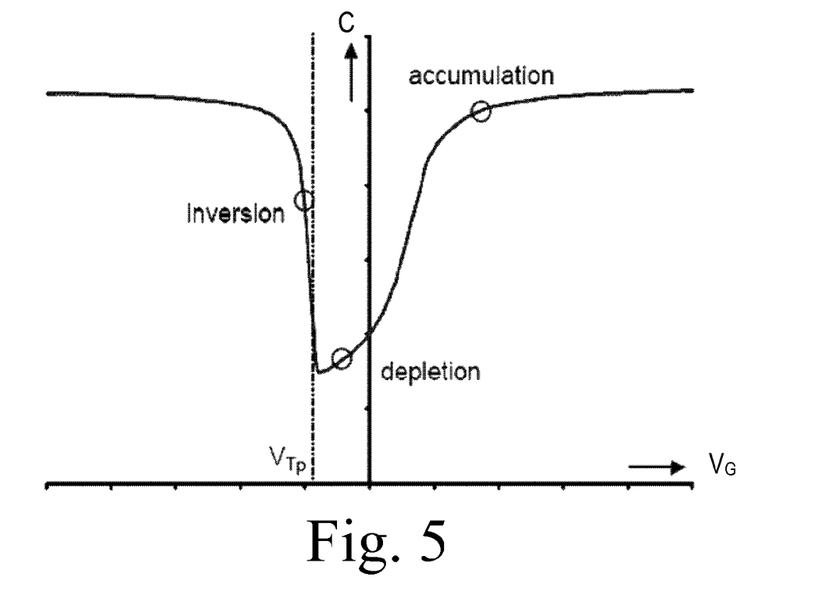
FIG. 5. shows the non-linearity of a gate-oxide capacitor of a PMOS transistor as a function of gate voltage with drain and source short circuited.

It will now be explained in detail how to build and use the present invention. First, reference is made to FIG. 5 showing the capacitance C of a gate capacitor of a PMOS transistor as a function of gate voltage $V_G$ with drain and source short-circuited. As can be seen from FIG. 5 the capacitance value C drops significantly near zero gate voltage. In this region the silicon underneath the gate-oxide is in depletion. For positive gate voltages $V_G$ the gate starts attracting electrons that form a so-called accumulation layer near the oxide interface. For negative voltages lower than the PMOS threshold voltage $V_{Tp}$ an inversion layer consisting of holes is formed near the oxide interface. In both accumulation and inversion the capacitance C converges to:

$$C_{ox} = W \cdot L \cdot \frac{\varepsilon}{t} -|$$

where W and L are the width and length of the PMOS gate, $t_{ox}$ is the thickness of the gate-oxide and $\varepsilon_{ox}$ is the permittivity of silicon-dioxide.

Figure 6:
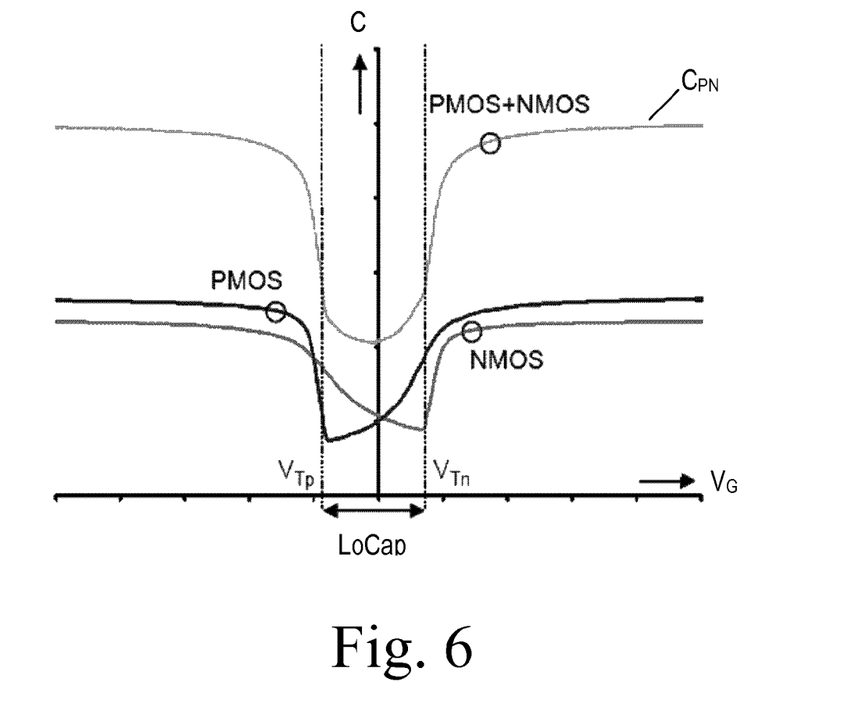
FIG. 6. shows a characteristic of summation of PMOS and NMOS capacitances.
Figure 7:
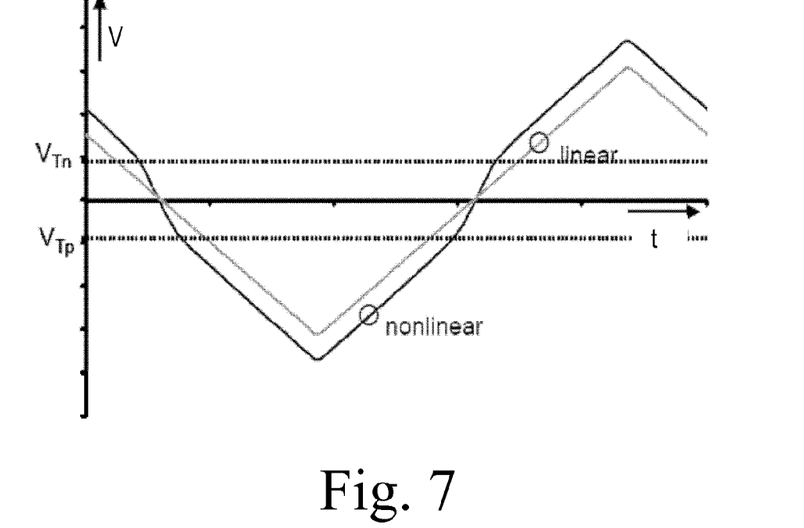
FIG. 7. shows the distortion of an integrator output.

For NMOS transistors the gate capacitance looks similar but is mirrored with respect to the voltage. Connecting a PMOS and NMOS in parallel results in a smoother capacitance as shown in FIG. 6. The resulting capacitance $C_{PN}$ is almost symmetrical around zero volt and drops to about 40% of the maximum value. The threshold voltages $V_{Tn}$ and $V_{Tp}$ of the NMOS and PMOS transistors determine the boundaries of the low capacitance range LoCap. When this capacitor is applied in an integrator with a square wave input signal the output signal is not a perfect triangle but has an increased voltage slope near the zero crossings as shown in FIG. 7.

Figure 8:
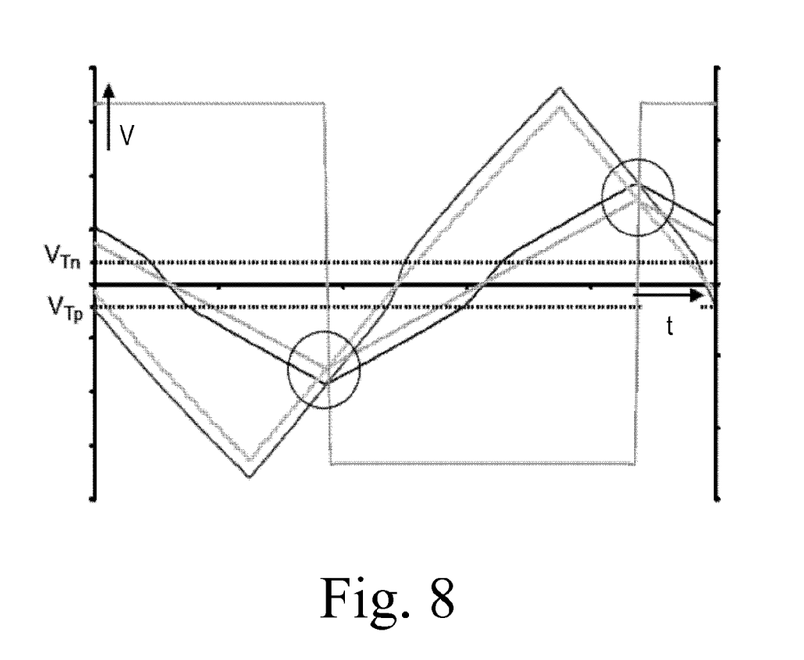
FIG. 8. shows the intersection of linear and non-linear integrators, particularly the output voltages of the first integrator, the second integrator and the comparator.

When the capacitance value drops, for example, to 40% this means the slope increases by a factor of 2.5. If the distorted triangular wave shown in FIG. 7 would be used for feed-forward PWM this would result in severe distortion. However, in the feedback configuration of the circuit shown in FIG. 2 the outputs of two integrators are compared to determine the edges of the PWM signal. If both integrators have identical non-linearity the moments that the integrator output signals intersect are not affected as shown in FIG. 8.

So it appears that non-linearity of the capacitors $C_1$, $C_2$ is not relevant for the performance of the closed loop configuration of FIG. 2. The non-linearity of the capacitors $C_1$, $C_2$ behaves as if the voltage axis in FIG. 8 is inflated in the region around zero. The non-linearity only affects the voltage level where the integrator outputs intersect but not the time.

There is a catch, which has to do with the zero in the loop transfer. Since the output voltage of the first integrator $g_{m1}$ is distorted the current injected through resistor $R_2$ into the virtual ground of the second integrator $g_{m2}$ is equally distorted. The inflation of the voltage around the zero crossing causes the resistor $R_2$ to appear smaller than it is, effectively moving the zero to a higher frequency. Resistor $R_2$ can be seen as having an effective value, which is determined by the amplitude of the output signal of the first integrator $g_{m1}$ relative to the low capacitance region LoCap of the non-linear capacitors $C_1$, $C_2$. When the output of the first integrator $g_{m1}$ is in the low capacitance region the value of the resistor $R_2$ appears to be higher. Outside the low capacitance region LoCap the value of resistor $R_2$ appears normal. In the situation shown in FIG. 8 the low capacitance region LoCap is about one fifth of the peak-to-peak value. Consequently the resistor $R_2$ appears to be 2.5 times smaller for one fifth of the time. This results in an effective value of approximately 4/5*100%+1/5*40%=88% of the nominal value. This effect appears to be only small but the situation changes when the amplifier is driven near clipping. As can be seen in FIG. 3b and FIG. 3c the amplitude of the output signal of the first integrator decreases when the amplifier is driven. Consequently, the effective value of $R_2$ decreases rapidly. If the resulting (effective) value of the zero $\omega_z$ exceeds the unity-gain frequency $\omega_{ug}$ this can cause instability of the feedback loop.

Figure 9:
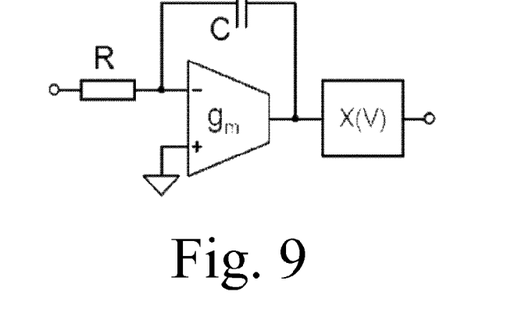
FIG. 9. shows a schematic circuit for modelling of non-linearity.

An alternative way to approach this is to recognize that the effect of non-linearity in the capacitors can be modelled as a non-linear factor X(V) which is a function of voltage in series with a linear integrator as shown in FIG. 9. In the model of FIG. 9 there is a block representing the non-linear factor X(V) connected to the output of an integrator $g_m$ which has an input resistor R and a feedback capacitor C.

Figure 10:
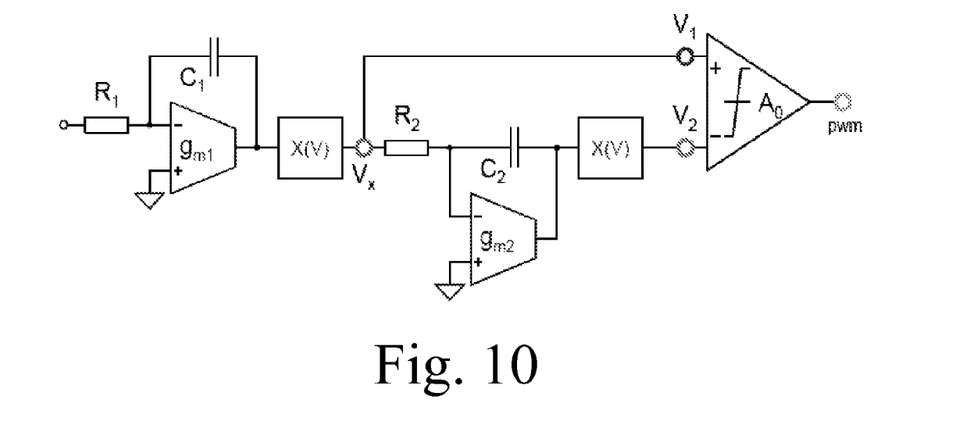
FIG. 10. shows a circuit including modelling non-linearity in feedback configuration.
Figure 11:
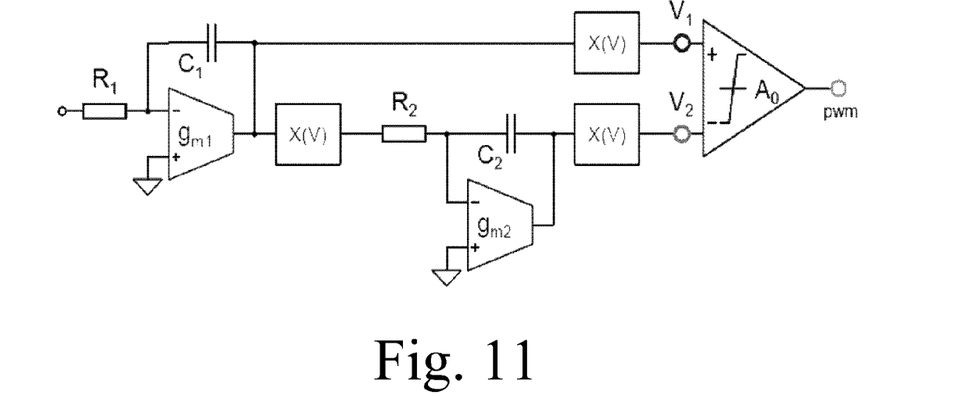
FIG. 11. shows circuit equivalence by shifting non-linearities.

Extending this modelling to the integrator part of the feedback configuration shown in FIG. 2 results in the circuit shown in FIG. 10. The non-linear factor X(V) in series with the first integrator $g_{m1}$ can be shifted through the node $V_x$ resulting in the equivalent circuit shown in FIG. 11.

Figure 12:
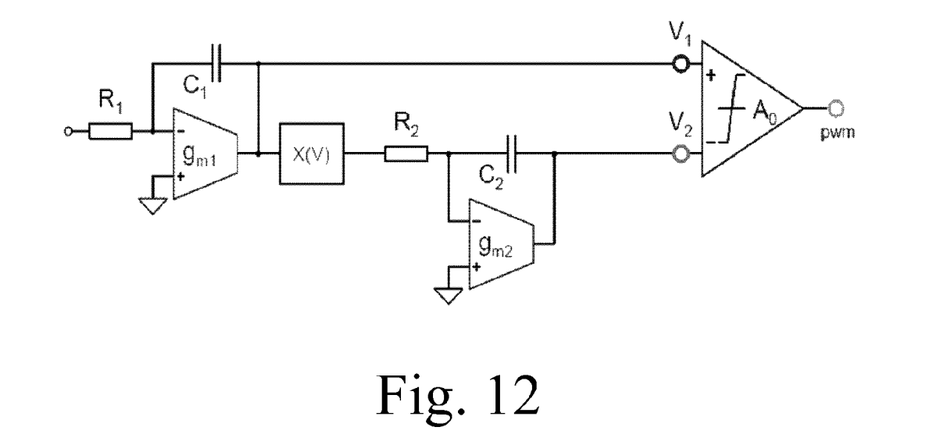
FIG. 12. shows another circuit equivalence by eliminating irrelevant non-linearities.

Now since the non-linear factors X(V) at the inputs of the comparator $A_0$ are identical they do not affect the comparison and can therefore be eliminated resulting in the equivalent circuit shown in FIG. 12.

As can be seen in FIG. 12 the only remaining effect of the non-linearity is in series with resistor $R_2$. This effect can be countered by making the resistor $R_2$ inversely non-linear $X^{-1}(V)$ such that the effect of X(V) is compensated as shown in FIG. 13.

Figure 14:
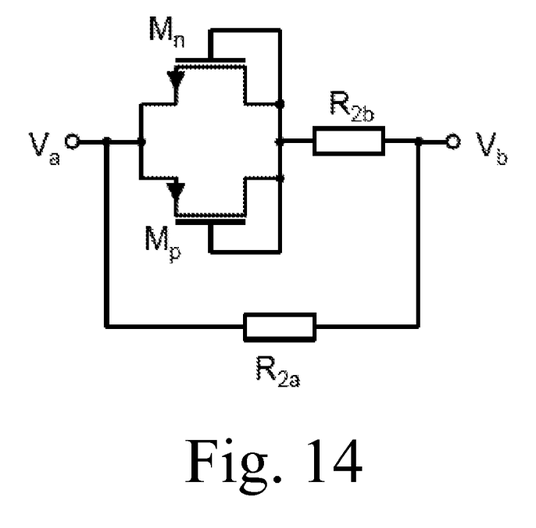
FIG. 14. shows an implementation of an inverse non-linearity circuit.

A simple circuit implementation of this inverse non-linearity $X^{-1}(V)$ is shown in FIG. 14. It comprises an NMOS transistor $M_n$ and a PMOS transistor $M_p$ having their source and drain terminals connected to each other with the gate terminals short-circuited to the drain terminals, thereby operating both the NMOS transistor $M_n$ and the PMOS transistor $M_p$ as diodes. The source terminals of the two transistors $M_n$, $M_p$ are connected to an input terminal $V_a$, their drain terminals are connected to a resistor $R_{2b}$ having its other terminal connected to an output terminal $V_b$. Another resistor $R_{2a}$ connects the input terminal $V_a$ with the output terminal $V_b$. For small voltages both NMOS and PMOS diodes are not conducting and the resistance value is determined by $R_{2a}$ only. For positive voltages larger than $V_{Tn}$ and negative voltages lower than $V_{Tp}$ either the NMOS diode or the PMOS diode starts conducting and the resistor value becomes equal to $R_{2a}$ and $R_{2b}$ connected in parallel.

Figure 15:
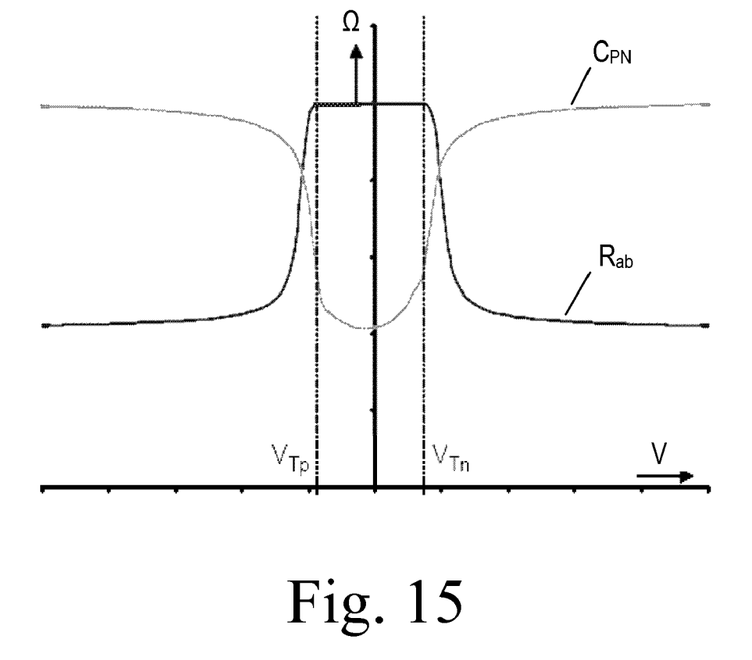
FIG. 15. shows a characteristic of non-linearities of a resistance and a capacitance.

The resulting resistance $R_{ab}$ as a function of applied voltage V is shown in FIG. 15. For convenience the non-linear capacitance $C_{PN}$ is also plotted. The high-resistance region of the non-linear resistance $R_{ab}$ tracks the low capacitance region of the non-linear capacitance $C_{PN}$ since they are both determined by the threshold voltages $V_{Tp}$, $V_{Tn}$ of the same transistors.

Figure 13:
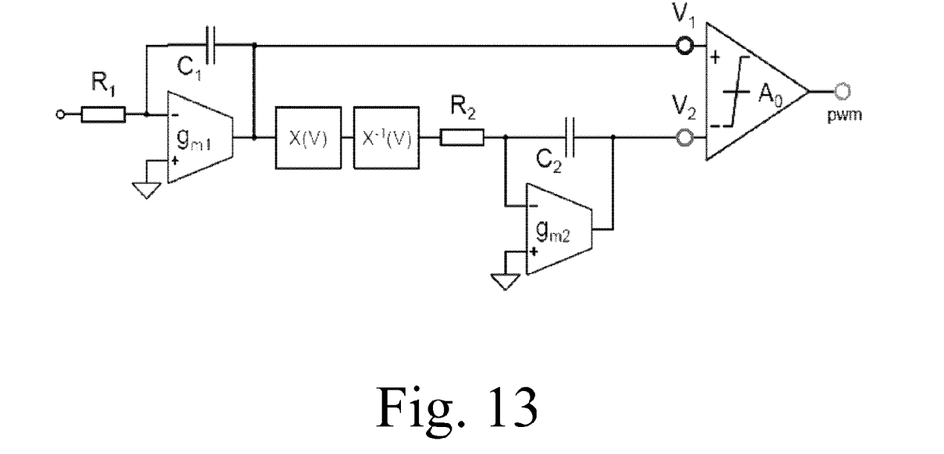
FIG. 13. shows a circuit being designed to compensate non-linearity.
Figure 16:
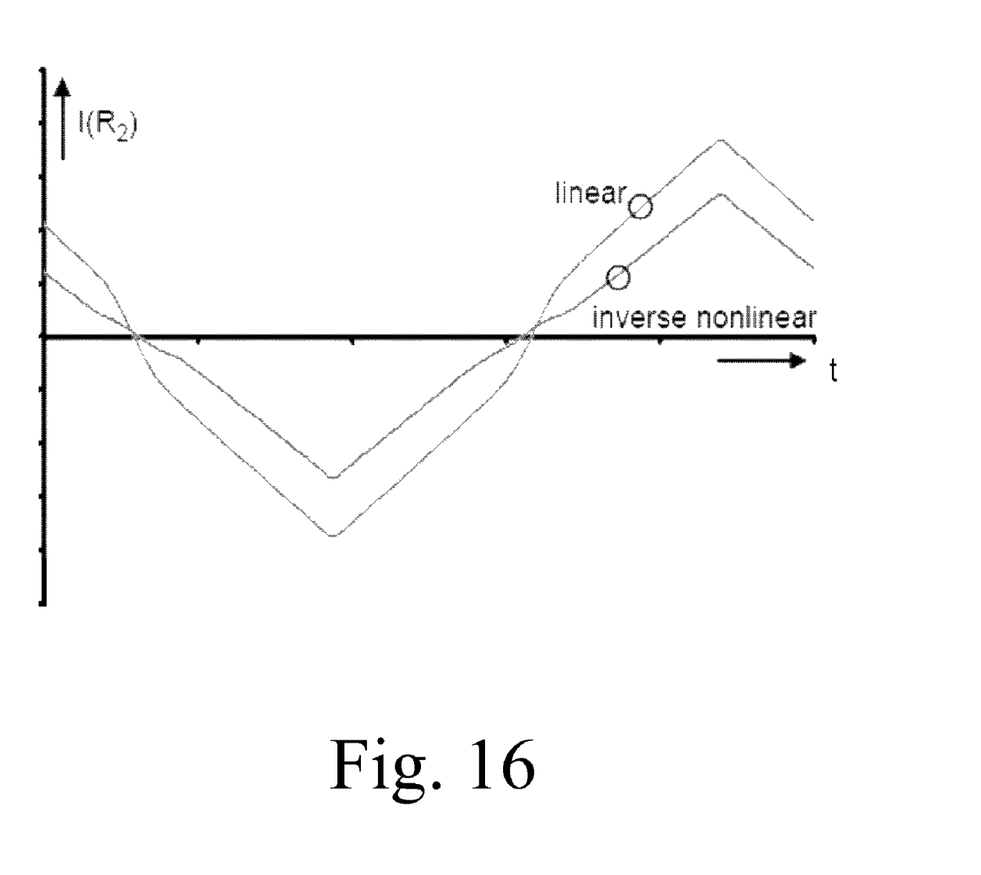
FIG. 16. shows the linearized current flowing through resistor $R_2$.

When resistor $R_2$ of the feedback configuration of FIG. 13 is configured as the circuit according to FIG. 14 the linearizing effect of the non-linear resistance $R_{ab}$ can be seen in FIG. 16 by inspecting the current $I(R_2)$ through said non-linear resistor $R_2$ in comparison to the linear resistor $R_2$ of the feedback configuration of FIG. 2. The curve marked 'linear' shows the current through resistor $R_2$ when a linear resistor is used (as in FIG. 2). As can be seen the curve shows the same non-linearity as the output voltage of the first integrator. The curve marked 'inverse non-linear' shows the current through $R_2$ when the circuit shown in FIG. 14 is used. The linearizing effect of the circuit can clearly be seen. The accuracy of the compensation does not need to be perfect since the whole system is contained in the feedback loop and imperfections will be suppressed by the loop-gain.

The invention can be applied in integrated class-D audio power amplifiers, e.g. in an amplifier circuit as shown in FIG. 2, wherein the capacitors $C_1$, $C_2$ are configured with a capacitance with a non-linear factor X(V) and wherein a circuit with an inversely non-linear factor $X^{-1}(V)$ is arranged in the path between the output of the first integrator $g_{m1}$ and the inverting input of the second integrator $g_{m2}$. Preferably, the resistor $R_2$ is built as a circuit with an inversely non-linear factor $X^{-1}(V)$, e.g. by using the circuit suggested in FIG. 14. It should be noted that the non-linear factor X(V) of the capacitors $C_1$, $C_2$ should be the same for both capacitors. Further, it is suggested to implement the capacitors $C_1$, $C_2$ as non-linear gate-oxide capacitors, e.g. by combinations of PMOS and NMOS gate-oxide capacitors.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The indefinite article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. A pulse width modulation (PWM) circuit comprising:
 a first integrator comprising a first feedback capacitor and having an output;
 a second integrator comprising a second feedback capacitor and having an output;
 a comparator comprising a first input connected to the output of the first integrator; and
 a second input connected to the output of the second integrator,
 wherein a connection path comprising a resistor is established from the output of the first integrator to an input of the second integrator, and
 wherein the first and second feedback capacitors have capacitances with a non-linearity, and wherein a circuit with an inverse non-linearity is arranged in a connection path between the output of the first integrator and said input of the second integrator.

2. The PWM circuit as claimed in claim 1, wherein the non-linearities of the capacitances of the capacitors are essentially equal.

3. The PWM circuit as claimed in claim 1, wherein the capacitors are implemented as non-linear gate-oxide capacitors, preferably by combinations of PMOS and NMOS gate-oxide capacitors.

4. The PWM circuit as claimed in claim 1, wherein the resistor is incorporated in the circuit with the inverse non-linearity.

5. The PWM circuit as claimed in claim 4, wherein the circuit with the inverse non-linearity comprises two anti-parallel connected diodes being serially connected to a first resistor, and a second resistor bypassing the anti-parallel diodes and the first resistor.

6. The PWM circuit as claimed in claim 5, wherein the two anti-parallel connected diodes are MOS diodes, preferably a NMOS and a PMOS diode.

7. The PWM circuit as claimed in claim 6, wherein the two anti-parallel connected diodes are configured by a NMOS transistor and a PMOS transistor having their source and drain terminals connected to each other with the gate terminals short-circuited to the drain terminals.

8. A Class-D amplifier comprising a PWM circuit as claimed in claim 1, further comprising a switch control with an input being connected to an output of the comparator of the PWM circuit, and having outputs driving an amplifying stage, wherein an output signal of the amplifying stage is smoothed in a low pass filter.

9. The Class-D amplifier as claimed in claim 8, further comprising a feedback path from an output of the amplifying stage to an input of the first integrator, and a resistor is arranged in the feedback path.

* * * * *